United States Patent [19]

Teyssie et al.

[11] Patent Number: 4,826,941

[45] Date of Patent: May 2, 1989

[54] PROCESS FOR THE ANIONIC POLYMERIZATION OF ACRYLIC MONOMERS AND OPTIONALLY OF VINYL COMONOMERS

[75] Inventors: Philippe Teyssie, Neuville-en-Condroz; Sunil K. Varshney, Liege; Robert Jerome, Tilff; Roger Fayt, Neupre, all of Belgium

[73] Assignee: Societe Chimique des Charbonnages S.A., France

[21] Appl. No.: 134,373

[22] Filed: Dec. 18, 1987

[30] Foreign Application Priority Data

Dec. 19, 1986 [FR] France ................. 86 17790

[51] Int. Cl.$^4$ ............. C08F 2/00; C08F 4/46
[52] U.S. Cl. ................... 526/173; 526/209; 526/328; 526/245; 525/271; 525/309
[58] Field of Search ................. 526/173, 209

[56] References Cited

U.S. PATENT DOCUMENTS 3,274,168  9/1966  Miller et al. ............ 526/175
3,687,978  8/1972  Pedersen ................ 526/209

FOREIGN PATENT DOCUMENTS 0185641  10/1985  European Pat. Off. .
2201304  10/1973  France .
2398079   7/1977  France .

OTHER PUBLICATIONS

Chemistry of Organic Compounds text by Noller, p. 726.

Primary Examiner—Joseph L. Schofer
Assistant Examiner—N. Sarofin
Attorney, Agent, or Firm—Finnegan, Henderson, Farabow et al.

[57] ABSTRACT

A process for the polymerization of acrylic monomers and optionally of vinyl comonomers using (i) an initiator of formula (I):

$$R-M \qquad (I)$$

in which M denotes a metal selected from the group consisting of alkali metals and alkaline earth metals and R denotes a straight-chain or branched alkyl radical containing 2 to 6 carbon atoms or an aryl radical, and (ii) at least one non-nitrogenous macrocyclic complexing agent.

The polymerization process is used to make products of acrylic polymers having a narrow distribution of molecular masses.

14 Claims, No Drawings

PROCESS FOR THE ANIONIC POLYMERIZATION OF ACRYLIC MONOMERS AND OPTIONALLY OF VINYL COMONOMERS

BACKGROUND OF THE INVENTION

The present invention relates to a process for the polymerization of acrylic monomers and optionally of vinyl comonomers using an initiator of formula (I):

R—M          (I)

in which M denotes a metal chosen from the group selected from alkali metals and alkaline earth metals and R denotes a straight-chain or branched alkyl radical containing 2 to 6 carbon atoms or an aryl radical.

Processes for the polymerization of acrylic or methacrylic monomers, such as alkyl acrylates and methacrylates, as well as processes for the copolymerization of acrylic or methacrylic monomers with vinyl comonomers, in the presence of various initiators, especially those of formula (I) given above are known. Examples of such initiators are sec-buthyllithium, napthalenesodium, 1,4-disodio-1,1,4,4-tetraphenylbutane, diphenylmethylpotassium, diphenylmethylsodium, 1'-methylstyryllithium, 1,1-diphenyl-3-methylpentyllithium and others, such as tertiary alcoholates of lithium and compounds containing trimethylsilyl groups.

In polymerizing acrylic monomers and optionally non-acrylic comonomers, it is known to use additives or various catalysts, especially cocatalysts or additives containing, for example, sources of fluoride, cyanide or acid ions or consisting of a Lewis acid. Finally, the use of an alkali metal or alkaline earth metal salt of an inorganic acid is known from European Patent Application No. 0,185,641.

On the other hand, French Pat. No. 2,201,304 describes the polymerization of vinyl monomers, especially of alkyl or cycloalkyl acrylates and methacrylates, with anionic initiators in an organic solvent medium and in the presence of a nitrogenous macroheterocyclic complexing agent in a quantity that is at least equimolar relative to the anionic initiator. This patent further describes the polymerization of methyl methacrylate at −78° C. and +25° C. in benzene or tetrahydrofuran. The French certificate of addition No. 2,398,079, attached to this patent, describes a variation in which the polymerization occurs in the absence of a solvent. In the case of methyl methacrylate, the polymerization is carried out at −40° C. and −80° C. respectively and leads to polymers having number average molecular masses of 150,000 and 400,000, respectively.

SUMMARY OF THE INVENTION

It has now been discovered that it is advantageous to carry out the polymerization of acrylic or methacrylic monomers, where appropriate with vinyl comonomers, by polymerizing the acrylic or methacrylic monomers in the presence of (i) initiator of formula (I) R—M and (ii) a non-nitrogenous macrocyclic complexing agent. In formula (I), M denotes a metal selected from the group consisting of alkali metals and alkaline earth metals and R denotes a straight chain or branched alkyl radical containing 2 to 6 carbon atoms or an aryl radical.

The present inventors have observed that the use of a non-nitrogenous macrocyclic complexing agent in addition to the initiator of formula (I) R—M offers remarkable advantages. This complexing agent enables a narrower distribution of masses of the resulting polymers and copolymers and polymers having predetermined structures and masses to be prepared.

Without being bound by theory, it is believed that the use of a non-nitrogenous macrocyclic complexing agent in the process according to the invention enables the reactivity of the initiator to be controlled. It is believed that the complexing agent advantageously reduces the reactivity of this initiator and makes it selective towards the double bond of the acrylic or methacrylic monomer rather than towards the ester group of this monomer.

The above and other features and advantages of the present invention will be made more apparent from the following description of the preferred embodiment.

DETAILED DESCRIPTION OF THE PREFERRED EMBODIMENT

Examples of the non-nitrogenous macrocyclic complexing agents that can be used as additives within the scope of the present invention include cyclic polyethers, which are also known as crown ethers, and cyclic polythioethers, such as macrocyclic polyethers. The macrocyclic ring of the polyether preferably contains at least 14 carbon and oxygen atoms. Each oxygen atom of the ring is preferably separated from the other oxygen atoms of the ring by two or three carbon atoms. Such macrocyclic polyethers have already been described in U.S. Pat. No. 3,687,978.

More precise examples are in particular:

1,4,7,10,13,16-hexaoxacyclooctadecane,
2,3,11,12-dibenzo-1,4,7,10,13,16-hexaoxacyclooctadeca-1,11-diene,
2,3,12,13-dibenzo-1,4,11,14-tetraoxacycloeicosa-2,12-diene,
2,3,12,13,22,23-tribenzo-1,4,11,14,21,24-hexaoxacyclotriaconta-2-12-22-triene,
2,2,7,7,12,12,17,17-octamethyl-21,22,23,24-tetraoxaquaterene,
2,3-benzo-1,4,7,10,13-pentaoxacyclopentadeca-2-ene,
2,3-(4'-t-butyl)-1,4,7,10,13,16-hexaoxacyclooctadeca-2-ene,
2,3,9,10-dibenzo-1,4,8,11-tetraoxacyclotetradeca-2,9-diene,
2,3,32,33-dibenzo-1,4,7,10,13,16,19,22,25,28,31,34,37,40,43,46,49,52,55,58-eicosaoxacyclohexaconta-2,32-diene,
2,3,16,17-dibenzo-1,4,15,18-tetraoxacyclooctacosa-2,16-diene,
2,6,13,17-tetraoxatricyclo[16.4.0.0$^{7,12}$]docosane,
2,5,8,15,18,21-hexaoxatricyclo[20.4.0.0$^{9,14}$]hexacosane,
2,5,12,15,18-pentaoxatricyclo[17.4.0.0$^{6,11}$]tricosane,
2,6,13,16,19-pentaoxatricyclo[18.4.0.0$^{7,12}$]tetracosane,
9,10-benzo-2,5,8,11,14,17-hexaoxabicyclo[16.4.0]-docosa-9-ene,
2,3,9,10-dibenzo-1,4,8,11,14,16-hexaoxacyclooctadeca-2,9-diene,
2,3,11,12-dibenzo-1,4,7,10,13,16,18-heptaoxacycloeicosa-2,11-diene,
2,3,13,14-dibenzo-8-pentamethylene-1,4,7,9,12,15,18-heptaoxacycloeicosa-2,13-diene,
2,3,13,14-dibenzo-1,4,7,9,12,15,18,20-octaoxacyclodocosa-2,13-diene,
2,4-(1',8'-naphthylene)-1,5,8,11,14-pentaoxacyclohexadeca-2-ene.

Acrylic acid esters, methacrylic acid esters, dialkyl(meth)acrylamides, acrylonitrile, methacrylonitrile and their mixtures may advantageously be employed as acrylic monomers in the process according to the invention. The acrylic monomer is preferably an alkyl methacrylate having an alkyl radical containing 1 to 18 carbon atoms. The alkyl radical can be either substituted or unsubstituted. Examples of such alkyl methacrylates include methyl methacrylate, 2,2,2-trifluoroethyl methacrylate and butyl methacrylate. The alkyl methacrylate can also preferably be a secondary or tertiary alkyl acrylate having an alkyl group containing from 3 to 8 carbon atoms. The alkyl group can be either substituted or unsubstituted. More particularly, such secondary or tertiary alkyl acrylates include isobutyl acrylate, tert-butyl acrylate and 2-ethylhexyl acrylate.

A vinyl comonomer such as, for example, butadiene, isoprene, styrene, vinylnaphthalene, 2-vinylpyridine, 4-vinylpyridine, alpha-methyl-styrene and tert-butylstyrene can be advantageously employed as a non-acrylic comonomer in the process according to the invention.

In the process according to the invention, the proportion of non-nitrogenous macrocyclic complexing agent relative to the initiator may vary widely. For example, this quantity of the complexing agent may be in a large excess relative to the molar quantity of the initiator. The quantity of the complexing agent may also be equal to or less than the molar quantity of the initiator. The complexing agent is preferably in a molar proportion relative to the initiator which is at least equal to 0.5 and which may range up to approximately 5.

According to one embodiment of the process according to the invention, the polymerization reaction may be carried out in the presence, in addition, of an alkali metal or alkaline earth metal salt. Preferably, a halide or a boride of such a metal such as, for example, sodium tetraphenylboron or lithium chloride is used. This salt may be employed in a molar proportion ranging up to approximately 2 relative to the initiator.

The process according to the invention enables polymers and copolymers having ends of chains functionalized by at least one group, such as a carboxylic group (COOH), to be prepared and block copolymers to be formed.

In the process according to the invention, the polymerization or the copolymerization is preferably carried out in the absence of moisture and oxygen, and in the presence of at least one solvent. The solvent is preferably chosen from aromatic solvents, such as benzene and toluene, tetrahydrofuran, diglyme, tetraglyme, orthoterphenyl, biphenyl, decalin or tetralin.

As regards the polymerization of copolymerization temperature, it may vary between approximately $-78°$ C. and $0°$ C.

The process according to the invention enables the preparation of a whole range of homopolymers and block copolymers generally having a number average molecular mass of between approximatley 10,000 and 300,000 and a polydispersity index generally between approximately 1.1 and 4. The block copolymers include, as new polymers, particularly the following: polymers containing at least one poly(2,2,2-trifluoroethyl methacrylate) block and, where appropriate, a polymer block of a monomer other than 2,2,2-trifluoroethylene methacrylate. These polymers are defined by a polydispersity of between approximately 1.1 and 4 and by a number average molecular weight of the poly(2,2,2-trifluoroethyl methacrylate) block preferably between approximately 10,000 and 300,000.

Such polymers are well suited for use in the production of photoresists for printed circuits. For such use, a solution is prepared at a concentration between about 4% and 20% by weight of the polymer in an inert solvent such as ketone. This solution is then deposited onto a substrate, such as silicium, before the solvent is evaporated to allow the formation on the substrate of a polymer film having a thickness of, for example, in the range of about 0.2 to 2 microns. Other polymers formed by the process of the present invention include polymers containing at least one secondary alkyl acrylate polymer block, the alkyl group containing from 3 to 10 carbon atoms, and, where appropriate, a polymer block of a monomer other than a secondary alkyl acrylate. These polymers are defined by a polydispersity of between approximately 1.1 and 4 and by a number average molecular weight of the poly(secondary alkyl acrylate) block preferably between approximately 10,000 and 100,000.

The process according to the invention is illustrated by the following non-limiting examples.

EXAMPLE 1

0.37 gram ($0.75 \times 10^{-3}$ mole) of 2,3,11,12-dibenzo-1,4,7,10,13,16-hexaoxacyclooctadeca-1,11-diene marketed by JANSSEN CHIMICA under the name "dibenzo-18-crown-6" is introduced under a nitrogen atmosphere into a round-bottomed flask which has been dried beforehand.

150 ml of previously dried tetrahydrofuran are added and a 0.2 molar solution of naphthalenesodium in tetrahydrofuran is added dropwise, with stirring, until a red color appears that persists. When this color is reached, 7.5 ml of the naphthalene-sodium ($1.5 \times 10^{-3}$ mole) are added. The mixture is cooled to a temperature of $-78°$ C. using a mixture of acetone and solid carbon dioxide and after ½ an hour, while still maintaining the temperature at $-78°$ C., 90 ml of a solution containing 0.057 mole of 2-ehtylhexyl acrylate in tetrahydrofuran, which has previously been dried using triethylaluminum (1 ml of a 1M solution in benzene) and distilled, are added.

The reaction is stopped after 5 hours by adding 5 ml of methanol, after which the solvent is removed. Poly(2-ethylhexyl acrylate) is obtained with a yield of 76%.

The analysis of the polymer by gel permeation chromatography gives the following values:
$M_n$ (number average molecular mass): 10,800
$M_w/M_n$ (polydispersity index): 1.7

In the present example as well as in the following examples, the tetrahydrofuran was dried beforehand over sodium/benzophenone.

EXAMPLE 2

0.252 gram (0.0007 mole) of "dibenzo-18-crown-6" and 29 mg of lithium chloride (0.0007 mole) are introduced under a nitrogen atmosphere into a round-bottomed flask which has previously been dried. 150 ml of previously dried tetrahydrofuran are added dropwise with stirring, and a 0.2 molar solution of naphthalenesodium in tetrahydrofuran is added, with stirring, until a red color appears that persists. When this color is reached, 3.75 ml of the naphthalenesodium solution (0.00075 mole) are added.

The mixture is cooled to a temperature of $-78°$ C. using a mixture of acetone and solid carbon dioxide and after ½ hour, a tetrahydrofuran solution containing 5 g of 2-ethylhexyl acrylate (0.028 mole), which has previously been dried using triethylaluminum and distilled, is added.

After maintaining the temperature at −78° C. for 3 hours, during which period the red color persists, the temperature is raised to −20° C. and maintained at this level for 20 hours (a yellow color appears). The reaction is then stopped by adding 5 ml of methanol, after which the solvent is removed. 4.9 g of the polymer are obtained (yield: 98%).

The analysis of the polymer by gel permeation chromatography gives the following values:

| $M_n = 19,500$ | $M_w/M_n = 2.1$ |
|---|---|

EXAMPLE 3

0.277 g (0.0008 mole) of "dibenzo-18-crown-6" is introduced, under a nitrogen atmosphere, into a round-bottomed flask which has previously been dried.

150 ml of previously dried tetrahydrofuran are added thereto and a 0.2 molar solution of naphthalenesodium in tetrahydrofuran is added dropwise, with stirring, until a red color appears that persists. When this color is reached, 4 ml of the naphthalenesodium solution (0.0008 mole) are added. The mixture is cooled to a temperature of −78° C. in a mixture of acetone and solid carbon dioxide and after ½ an hour, while still maintaining the temperature at −78° C., 90 ml of a solution containing 0.046 mole of 2,2,2-trifluoroethyl methacrylate in tetrahydrofuran, which has previously been dried using triethyl aluminum (1 ml of a 1M solution in benzene) and distilled, are added.

The reaction is stopped after 4 hours by adding 5 ml of methanol, after which the solvent is removed. 7 g of the polymer are obtained to produce a yield of 100%.

The analysis of the polymer by gel permeation chromatography gives the following values:

| $M_n = 26,000$ | $M_w/M_n = 1.23$ |
|---|---|

EXAMPLE 4

The experiment in Example 3 is repeated with the following exception: before introducing the "dibenzo-18-crown-6", 29 mg of lithium chloride (0.0007 mole) are introduced into the round-bottomed flask. After 4 hours of reaction, 7 grams of poly(2,2,2-trifluroethyl methacrylate) are obtained to produce a yield of 100%.

The analysis of the polymer by gel permeation chromatography gives the following values:

| $M_n = 96,000$ | $M_w/M_n = 1.22$ |
|---|---|

EXAMPLE 5

$10^{-3}$ mole of "dibenzo-18-crown-6" is introduced, under a nitrogen atmosphere, into a round-bottomed flask which has previously been dried. One liter of previously dried tetrahydrofuran and a living chain member of poly(methylmethacrylate) initiated by diphenylmethylsodium (the latter at a rate of $10^{-3}$ mole, as a molar solution in tetrahydrofuran) are added. The mixture is cooled to a temperature of −78° C. using a mixture of acetone and solid carbon dioxide and a solution of 25 g of 2,2,2-trifluoroethyl methacrylate in tetrahydrofuran, which has previously been dried and distilled, are then added. The reaction is stopped after 4 hours by adding methanol, after which the solvent is removed. A copolymer containing methyl methacrylate/2,2,2-trifluoroethyl methacrylate blocks is obtained with a yield of 100%. The analysis of the copolymer by gel permeation chromatography gives the following values:

| $M_n$ (total) = | 33,000 |
|---|---|
| $M_w/M_n =$ | 1.33 |
| $M_n$ (methyl methacrylate block) = | 4,500 |
| $m_n$ (2,2,2-trifluoroethyl methacrylate block) = | 28,500 |

EXAMPLE 6

$5 \times 10^{-3}$ mole of "dibenzo-18-crown-6" is introduced, under a nitrogen atmosphere, into a round-bottomed flask which has previously been dried. 1 liter of previously dried tetrahydrofuran and $1.2 \times 10^{-3}$ mole of diphenylmethylsodium as a molar solution in tetrahydrofuran are added. The mixture is cooled to a temperature of −78° C. using a mixture of acetone and solid carbon dioxide and a solution of 150 g of 2,2,2-trifluoroethyl methacrylate in tetrahydrofuran, which has previously been dried and distilled, is then added. The reaction is stopped after 3 hours by adding methanol, after which the solvent is removed. The polymer is obtained with a yield of 90%.

The analysis of the polymer by gel permeation chromatography gives the following values:

| $M_n = 185,000$ | $M_w/M_n = 1.33$ |
|---|---|

Such a polymer is well suited for the production of photoresists for printed circuits.

EXAMPLE 7

$0.2 \times 10^{-3}$ mole of "dibenzo-18-crown-6" is introduced, under a nitrogen atmosphere, into a round-bottomed flask which has previously been dried. 120 ml of previously dried tetrahydrofuran and $0.2 \times 10^{-3}$ mole of naphtahlenesodium as a molar solution in tetrahydrofuran are added. The mixture is cooled to a temperature of −78° C. using a mixture of acetone and solid carbon dioxide and a solution of 5 g of isobutyl acrylate in tetrahydrofuran, which has previously been dried and distilled, is then added. The reaction is stopped after 4 hours by adding methanol, after which the solvent is removed. Poly(isobutyl acrylate) is obtained with a yield of 90%.

The analysis of the polymer by gel permeation chromatography gives the following values:

| $M_n = 37,000$ | $M_w/M_n = 2.0$ |
|---|---|

EXAMPLE 8

The experiment in Example 7 is repeated with the following exception: before introducing the "dibenzo-18-crown-6", $0.4 \times 10^{-3}$ mole of sodium tetraphenylboron is introduced into the round-bottomed flask. After 4 hours of reaction, the poly(isobutyl acrylate) is obtained with a yield of 100%.

The analysis of the polymer by gel permeation chromatography gives the following values:

| $M_n = 36,000$ | $M_w/M_n = 3.6$ |
|---|---|

EXAMPLE 9

$10^{-3}$ mole of "dibenzo-18-crown-6" is introduced, under a nitrogen atmosphere, into a round-bottomed flask which has previously been dried. 400 ml of previously dried tetrahydrofuran and $0.2 \times 10^{-3}$ mole of naphthalenesodium as a molar solution in tetrahydrofuran are added. The mixture is cooled to a temperature of $-78°$ C. using a mixture of acetone and solid carbon dioxide and a solution of 5 g of isobutyl acrylate in tetrahydrofuran, which has previously been dried and distilled, is then added. The reaction is stopped by adding methanol, after which the solvent is removed. Poly(isobutyl acrylate) is obtained with a yield of 81%.

The analysis of the polymer by gel permeation chromatography gives the following values:

| $M_n = 23,000$ | $M_w/M_n = 1.5$ |
|---|---|

EXAMPLE 10

$0.2 \times 10^{-3}$ mole of lithium chloride and $0.4 \times 10^{-3}$ mole of "dibenzo-18-crown-6" are introduced, under a nitrogen atmosphere, into a round-bottomed flask which has previously been dried. 100 ml of previously dried tetrahydrofuran and $0.2 \times 10^{-3}$ mole of naphthalenesodium as a molar solution in tetrahydrofuran are added. The mixture is cooled to a temperature of $-78°$ C. using a mixture of acetone and solid carbon dioxide and a solution of 5 g of methacrylonitrile in tetrahydrofuran, which has previously been dried and distilled, is then added. The reaction is stopped after 1 hour by adding methanol, after which the solvent is removed. The polymer is obtained with a yield of 62%.

What is claimed is:

1. A process for the polymerization of acrylic or methacrylic monomers comprising the step of polymerizing acrylic or methacrylic monomers in the presence of (i) an initiator of formula (I):

R—M     (I)

in which M denotes a metal selected from the group consisting of alkali metals and alkaline earth metals and R denotes a straight-chain or branched alkyl radical containing 2 to 6 carbon atoms or an aryl radical, and (ii) at least one non-nitrogenous macrocyclic complexing agent.

2. The process as claimed in claim 1, wherein the monomer is a secondary or tertiary alkyl acrylate having an alkyl group of 3 to 8 carbon atoms.

3. The process as claimed in claim 2, wherein the monomer is an alkyl methacrylate having an alkyl radical containing 1 to 18 carbon atoms.

4. The process as claimed in claim 2, wherein the monomer is isobutyl acrylate.

5. The process as claimed in claim 3, wherein the monomer is 2,2,2-trifluoroethyl methacrylate.

6. The process as claimed in claim 1, wherein the acrylic or methacrylic monomer is copolymerized with a vinyl monomer.

7. The method as claimed in claim 6, wherein the vinyl monomer is selected from the group consisting of butadiene, isoprene, styrene, vinylnaphthalene, 2-vinylpyridine, 4-vinylpyridine, alpha-methylstyrene and tert-butylstyrene.

8. The process as claimed in claim 1, wherein the polymerization is carried out at a temperature of between about $-78°$ C. and about $0°$ C.

9. The process as claimed in claim 1, further comprising the step of functionalizing the ends of the polymer chain by a carboxylic group.

10. The process as claimed in claim 1, wherein the polymerization is carried out in the presence of at least one solvent.

11. The process as claimed in claim 1, wherein the non-nitrogenous macrocyclic complexing agent is 2,3,11,12-dibenzo-1,4,7,10,13,16-hexaoxacyclooctadeca-1,11-diene.

12. The process as claimed in claim 1, wherein the polymerization is carried out in the presence of an alkali metal or alkaline earth metal salt.

13. The process as claimed in claim 1, wherein the molar proportion of the non-nitrogenous macrocyclic complexing agent relative to the initiator is at least equal to 0.5 and not more than 5.

14. The process according to claim 1, wherein the polymerization or copolymerization is carried out in the substantial absence of moisture and oxygen.

* * * * *